United States Patent
Wei

(10) Patent No.: US 9,298,230 B2
(45) Date of Patent: Mar. 29, 2016

(54) ELECTRONIC DEVICE

(71) Applicant: HON HAI PRECISION INDUSTRY CO., LTD., New Taipei (TW)

(72) Inventor: Chao-Ke Wei, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 6 days.

(21) Appl. No.: 14/474,862

(22) Filed: Sep. 2, 2014

(65) Prior Publication Data

US 2015/0062799 A1 Mar. 5, 2015

(30) Foreign Application Priority Data

Sep. 5, 2013 (TW) .............................. 102132080 U

(51) Int. Cl.
*H05K 7/20* (2006.01)
*G06F 1/20* (2006.01)
*G06F 1/18* (2006.01)

(52) U.S. Cl.
CPC *G06F 1/20* (2013.01); *G06F 1/187* (2013.01); *H05K 7/20736* (2013.01)

(58) Field of Classification Search
CPC ............................ G06F 1/206; H05K 7/20736
USPC .................................................... 361/679.49
See application file for complete search history.

(56) References Cited

U.S. PATENT DOCUMENTS

| 6,563,704 B2* | 5/2003 | Grouell | H05K 7/20136 |
| | | | 361/679.33 |
| 8,238,104 B2* | 8/2012 | Salpeter | H05K 7/1488 |
| | | | 165/104.33 |
| 8,743,549 B2* | 6/2014 | Frink | G06F 1/187 |
| | | | 361/679.49 |
| 9,141,156 B2* | 9/2015 | Ross | G06F 1/20 |
| 2005/0052843 A1* | 3/2005 | Baker | H05K 7/20736 |
| | | | 361/679.47 |
| 2008/0298014 A1* | 12/2008 | Franco | G06F 1/183 |
| | | | 361/688 |

* cited by examiner

*Primary Examiner* — Anthony Q Edwards
(74) *Attorney, Agent, or Firm* — Novak Druce Connolly Bove + Quigg LLP

(57) ABSTRACT

An electronic device includes a chassis and a plurality of electronic modules. The chassis includes a front plate, a rear plate, a top plate, two side plates, a bottom plate and a plurality of dividing plates. The electronic modules are set between two adjacent dividing plates. The front plate includes an air inlet defined in a bottom. A first space is defined between a bottom of each dividing plate and the bottom plate. A second space is defined between a top of each dividing plate and the top plate. At least one of the top of the dividing plate and the bottom of the dividing plate is arranged stepped down from the front plate to the rear plate. The airflow flows through the air inlet, the first space, then flows up through the electronic modules, and then flows to the rear plate.

6 Claims, 4 Drawing Sheets

ELECTRONIC DEVICE

FIELD

The subject matter herein generally relates to an electronic device.

BACKGROUND

Electronic modules such as hard disks are installed in an electronic device, such as a server or a computer. Generally, the electronic modules in the electronic device are orderly arranged in rows. Usually fans and air vents are used for cooling the electronic modules.

BRIEF DESCRIPTION OF THE DRAWINGS

Implementations of the present technology will now be described, by way of example only, with reference to the attached figures.

DETAILED DESCRIPTION

Figure 1:
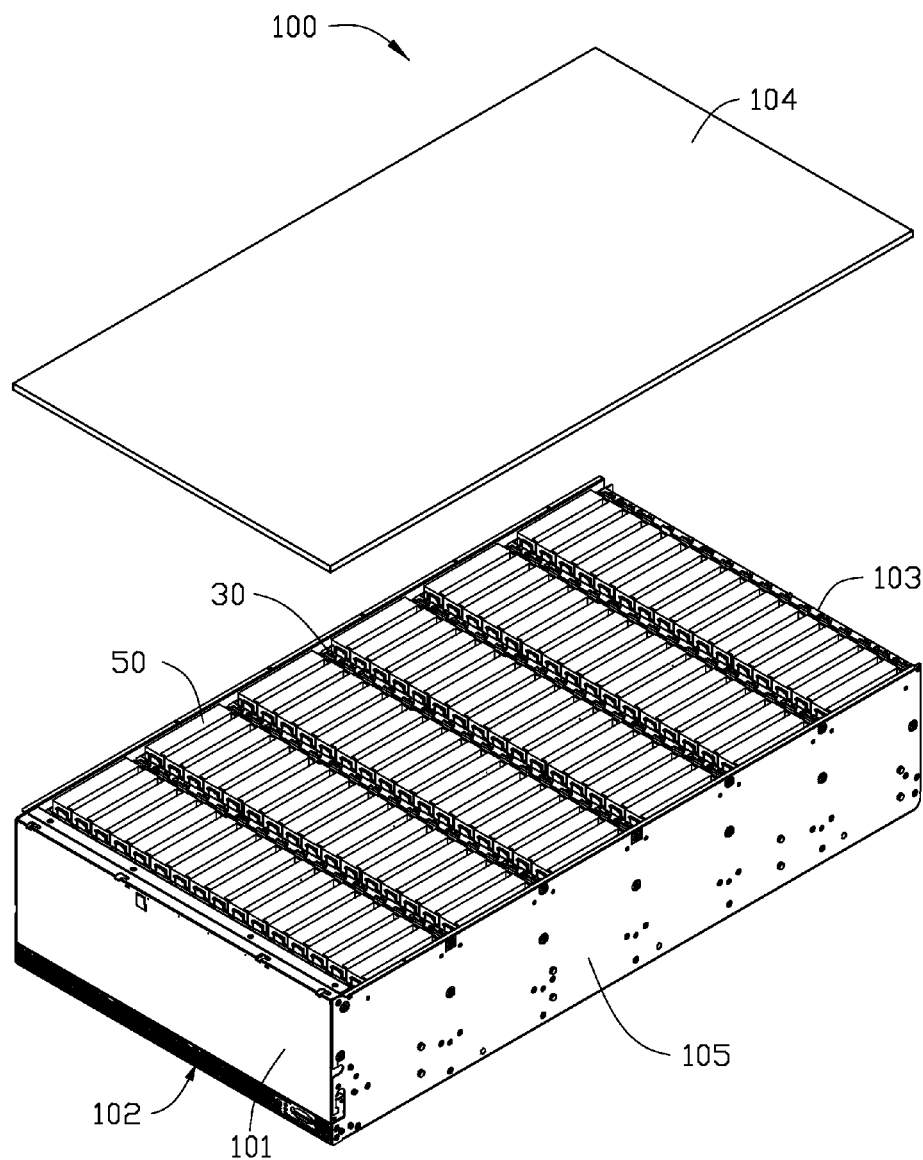
FIG. 1 is an exploded, isometric view of an embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiment described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The term "comprising," when utilized, means "including, but not necessarily limited to"; it specifically indicates open-ended inclusion or membership in the so-described combination, group, series and the like.

The present disclosure is described in relation to an electronic device.

Figure 2:
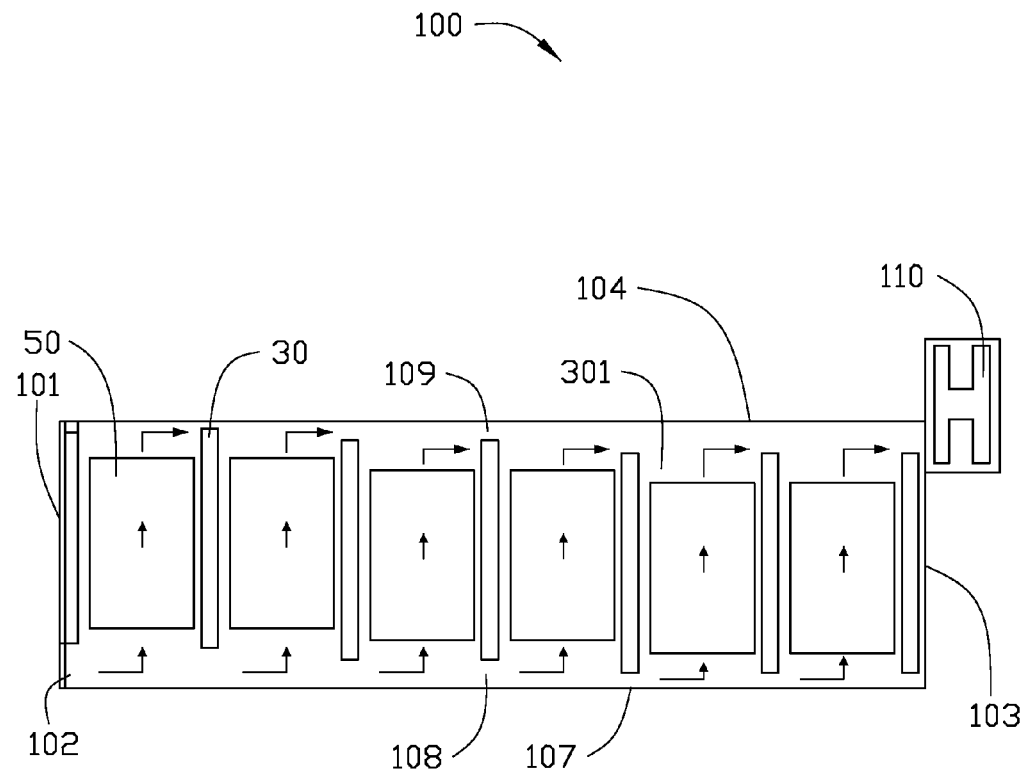
FIG. 2 is a diagrammatic view of an airflow path of a first embodiment of an electronic device.

FIGS. 1 and 2 illustrate a first embodiment of an electronic device. The electronic device includes a chassis 100 and a plurality of electronic modules 50. The chassis 100 includes a front plate 101, a rear plate 103, a top plate 104, two side plates 105, a bottom plate 107 and a plurality of dividing plates 30. The dividing plates 30 are parallel to and located between the front plate 101 and the rear plate 103, and perpendicularly connected to the two side plates 105. A space 108 is defined between a bottom of each dividing plate 30 and the bottom plate 107. A space 109 is defined between a top of each dividing plate 30 and the top plate 104. An airflow path 301 is defined between each two adjacent dividing plates 30. Each electronic module 50 is vertically set between two adjacent dividing plates 30. The dividing plates 30 are arranged stepped down from the front plate 101 to the rear plate 103. The space 109 orderly increases from the front plate 101 to the rear plate 103. The space 108 orderly decreases from the front plate 101 to the rear plate 103. A bottom of the front plate 101 defines an air inlet 102. In this embodiment, the electronic modules 50 are hard disk drive modules.

Figure 3:
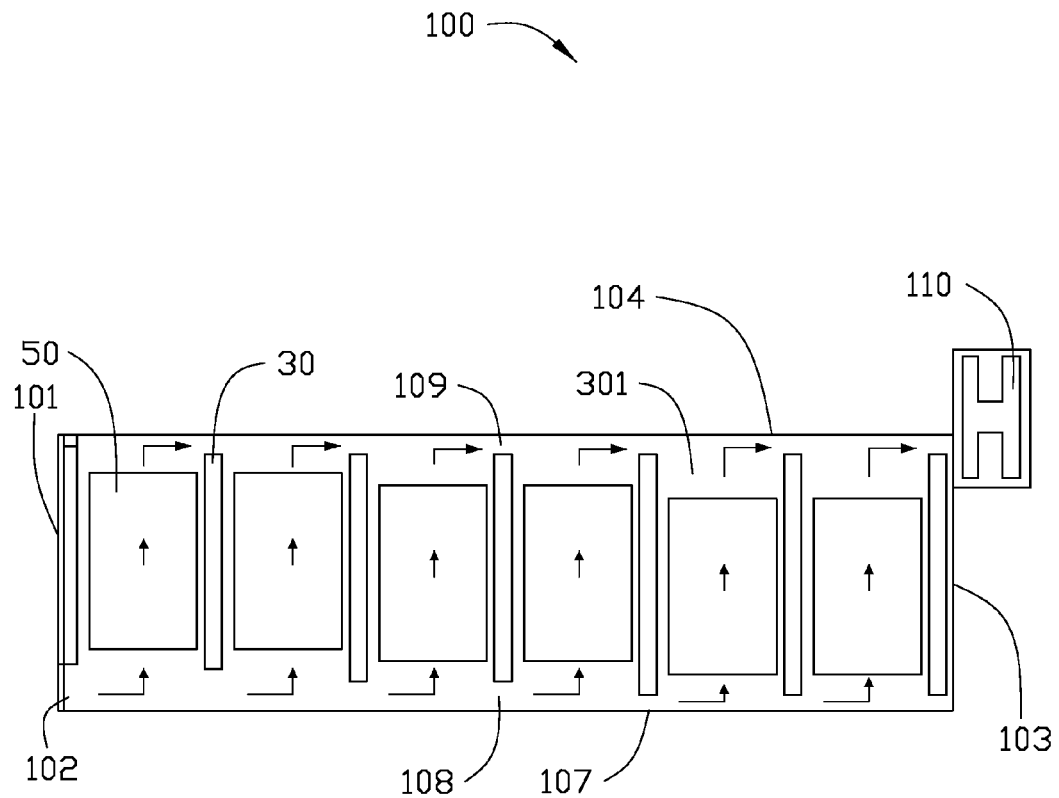
FIG. 3 is a diagrammatic view of an airflow path of a second embodiment of an electronic device.

FIG. 3 illustrates a second embodiment of an electronic device. In the embodiment, the bottoms of the dividing plates 30 are arranged stepped down from the front plate 101 to the rear plate 103. The spaces 109 between each top of the dividing plates 30 and the top plate 104 are equal. The spaces 108 orderly decrease from the front plate 101 to the rear plate 103.

Figure 4:
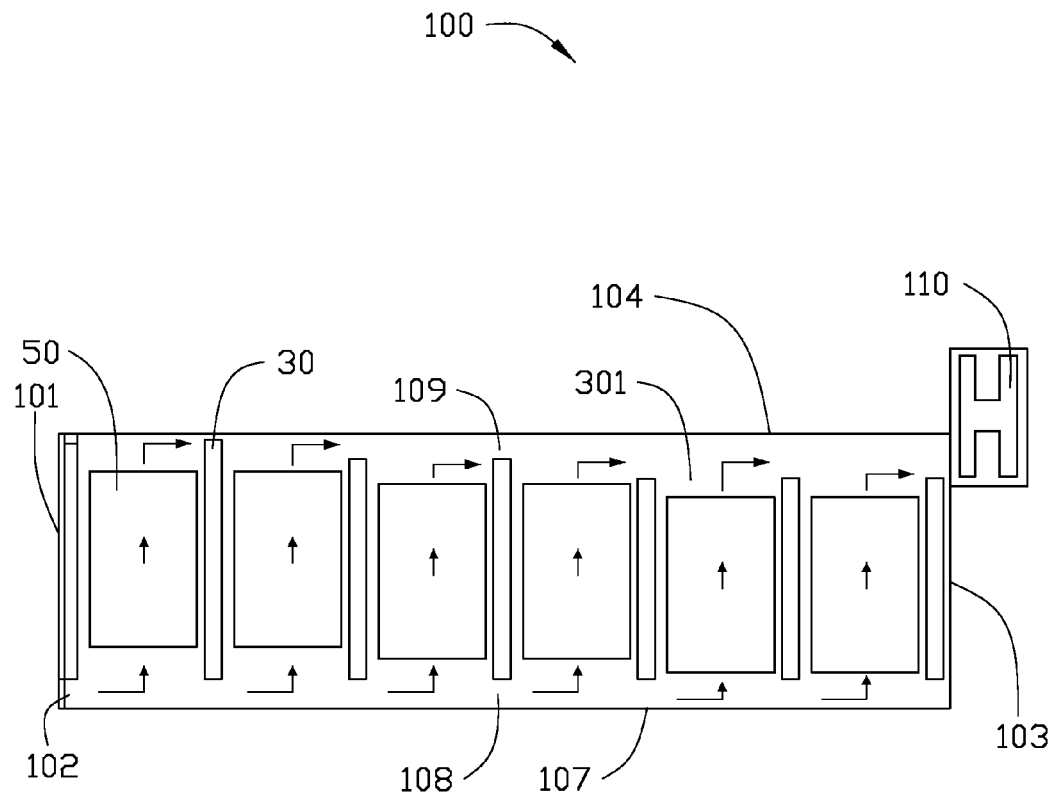
FIG. 4 is a diagrammatic view of an airflow path of a third embodiment of an electronic device.

FIG. 4 illustrates a third embodiment of an electronic device, the tops of the dividing plates 30 are arranged stepped down from the front plate 101 to the rear plate 103. The spaces 108 between each bottom of the dividing plates 30 and the bottom plate 107 are equal. The spaces 109 orderly increase from the front plate 101 to the rear plate 103.

FIGS. 2 to 4 illustrate that an air flow such as cooling air flows through the air inlet 102, the space 108, and upwardly through the electronic modules 50, and then flows out from the space 109. The chassis 100 includes a fan adjacent to the rear plate 103 to extract the airflow out from the chassis 100. The dividing plates 30 circumvent preheated air from the electronic modules 50 at the front of the chassis 100 from flowing to the electronic modules 50 at the rear of the chassis 100. The declined arrangement of the bottoms of the dividing plates 30 can allow for increased airflow, through the electronic modules 50 adjacent to the rear plate 103. The declined arrangement of the tops of the dividing plates 30 can improve the airflow flow out of the electronic modules 50 increasing the cooling effect of the electronic device.

It is to be understood, however, that even though numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. An electronic device, comprising:
   a chassis comprising a front plate, a rear plate, a top plate, two side plates, a bottom plate and a plurality of dividing plates comprising two adjacent dividing plates configured to define an airflow path therebetween; and
   a plurality of electronic modules vertically set between the two adjacent dividing plates;
   the plurality of dividing plates are parallel to and located between the front plate and the rear plate, and perpendicularly connected to the side plates;
   a bottom of each dividing plate and the bottom plate forming a first space;
   a top of each dividing plate and the top plate forming a second space;
   the dividing plates are arranged in a series of steps;
   the front plate comprises an air inlet in a bottom; and
   wherein airflow flows through the air inlet, the first space, and upwardly through the electronic modules, and exits through to the rear plate.

2. The electronic device of claim 1, wherein the first spaces of the dividing plates orderly decrease from the front plate to the rear plate, the second spaces orderly increases from the front plate to the rear plate.

3. The electronic device of claim 1, wherein the first spaces of the dividing plate orderly decrease from the front plate to the rear plate, and the second spaces between a top of each dividing plate and the top plate are equal.

4. The electronic device of claim 1, wherein the first spaces between a bottom of each dividing plate and the bottom plate are equal, and the second spaces orderly increase from the front plate to the rear plate.

5. The electronic device of claim 1, wherein the chassis also comprises a fan adjacent to the rear plate.

6. The electronic device of claim 1, wherein the electronic module are hard disk drive modules.

* * * * *